US012051590B2

(12) United States Patent
Jeong et al.

(10) Patent No.: US 12,051,590 B2
(45) Date of Patent: Jul. 30, 2024

(54) METHOD OF FORMING A PATTERN

(71) Applicant: SAMSUNG ELECTRONICS CO., LTD., Suwon-si (KR)

(72) Inventors: Yongchul Jeong, Suwon-si (KR); Sangjin Kim, Suwon-si (KR); Yigwon Kim, Seongnam-si (KR); Jinhee Jang, Seoul (KR); Taemin Choi, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 274 days.

(21) Appl. No.: 17/697,019

(22) Filed: Mar. 17, 2022

(65) Prior Publication Data

US 2023/0036420 A1    Feb. 2, 2023

(30) Foreign Application Priority Data

Aug. 2, 2021    (KR) ........................ 10-2021-0101163

(51) Int. Cl.
| | | |
|---|---|---|
| *H01L 21/033* | (2006.01) | |
| *G03F 7/20* | (2006.01) | |
| *H01L 21/02* | (2006.01) | |
| *H01L 21/027* | (2006.01) | |

(52) U.S. Cl.
CPC ........ *H01L 21/0337* (2013.01); *G03F 7/2002* (2013.01); *H01L 21/0206* (2013.01); *H01L 21/0274* (2013.01)

(58) Field of Classification Search
CPC ............. H01L 21/0337; H01L 21/0274; H01L 21/0206; G03F 7/2002
See application file for complete search history.

(56) References Cited

U.S. PATENT DOCUMENTS

| | | | |
|---|---|---|---|
| 5,275,963 A * | 1/1994 | Cederbaum | ....... H01L 21/76897 |
| | | | 438/626 |
| 7,033,738 B2 | 4/2006 | Byun et al. | |
| 8,277,564 B2 | 10/2012 | Le et al. | |
| 8,734,662 B2 | 5/2014 | Hsu et al. | |
| 9,048,268 B2 | 6/2015 | Chen et al. | |
| 10,048,589 B2 | 8/2018 | Godet et al. | |
| 10,276,373 B2 | 4/2019 | Jeong et al. | |
| 2005/0090113 A1 | 4/2005 | Chang | |
| 2015/0007856 A1 | 1/2015 | Jackson | |
| 2018/0096840 A1* | 4/2018 | Jeong | ................ H01L 21/31144 |
| 2020/0124970 A1 | 4/2020 | Kocsis et al. | |
| 2020/0133132 A1* | 4/2020 | Ouyang | ................ G03F 7/0043 |

FOREIGN PATENT DOCUMENTS

| | | |
|---|---|---|
| JP | 3905980 | 4/2007 |
| KR | 10-945922 | 3/2010 |
| KR | 10-2017-0053932 | 5/2017 |

\* cited by examiner

*Primary Examiner* — Binh X Tran
(74) *Attorney, Agent, or Firm* — F. CHAU & ASSOCIATES, LLC (57) ABSTRACT

A method of forming a pattern includes forming an etching object layer on a substrate. A photoresist layer including a metal, oxygen and an organic material is formed on the etching object layer. An exposure process is performed on the photoresist layer. A developing process is performed on the photoresist layer to form a photoresist pattern including a metal oxide. Ozone is provided onto the substrate to remove a residue of the photoresist layer that includes the organic material. The etching object layer is etched using the photoresist pattern as an etching mask.

20 Claims, 7 Drawing Sheets

METHOD OF FORMING A PATTERN

CROSS-REFERENCE TO RELATED APPLICATION

This application claims priority under 35 U.S.C. § 119 to Korean Patent Application No. 10-2021-0101163, filed on Aug. 2, 2021 in the Korean Intellectual Property Office, the disclosure of which is incorporated by reference in its entirety herein.

TECHNICAL FIELD

Example embodiments of the present disclosure relate to a method of forming a pattern. More particularly, example embodiments of the present disclosure relate to a method of forming a pattern by an etching process using a photoresist pattern.

DISCUSSION OF RELATED ART

A photoresist pattern serving as an etching mask may be formed by an exposure process and a developing process on a photoresist layer. However, after the developing process, the photoresist layer may partially remain, and thus, when an etching process is performed using the photoresist pattern as an etching mask, a shape of the remaining portion of the photoresist layer may be transferred to an etching object layer which may result in a decrease in the accuracy of the patterns that are formed.

SUMMARY

Example embodiments provide a method of forming a pattern having increased accuracy.

According to an example embodiment of the present disclosure, a method of forming a pattern includes forming an etching object layer on a substrate. A photoresist layer including a metal, oxygen and an organic material is formed on the etching object layer. An exposure process is performed on the photoresist layer. A developing process is performed on the photoresist layer to form a photoresist pattern including a metal oxide. Ozone is provided onto the substrate to remove a residue of the photoresist layer that includes the organic material. The etching object layer is etched using the photoresist pattern as an etching mask.

According to an example embodiment of the present disclosure, a method of forming a pattern includes forming an etching object layer on a substrate. A photoresist layer is formed on the etching object layer. The photoresist layer includes a metal, oxygen and an organic material. An exposure process is performed on a portion of the photoresist layer to form an exposed portion and a non-exposed portion of the photoresist layer. The exposed portion includes a metal oxide and the non-exposed portion includes the metal, the oxygen and the organic material. A developing process is performed on the photoresist layer to remove the non-exposed portion to form a photoresist pattern including the metal oxide. UV and heat is provided onto the substrate to remove a residue of the photoresist layer, the residue including the organic material. The etching object layer is etched using the photoresist pattern as an etching mask.

According to an example embodiment of the present disclosure, a method of forming a pattern includes forming an etching object layer on a substrate. A photoresist layer is formed on the etching object layer. The photoresist layer includes a metal, oxygen and an organic material. An exposure process is performed on a portion of the photoresist layer to form an exposed portion and a non-exposed portion of the photoresist layer. The exposed portion includes a metal oxide and the non-exposed portion includes the metal, the oxygen and the organic material. A developing process is performed on the photoresist layer to remove the non-exposed portion to form a photoresist pattern including the metal oxide. Ozone is provided onto the substrate to remove a residue of the photoresist layer, the residue including the organic material. A cleansing process is performed on the photoresist pattern after providing ozone onto the substrate. The etching object layer is etched using the photoresist pattern as an etching mask.

In the method of forming the pattern according to an embodiment of the disclosure, after performing the exposure process and the developing process on the photoresist layer including the organic material to form the photoresist pattern, ozone may be provided to be reacted with the residue of the photoresist layer including the organic material, so that the residue may be removed. The demising process may be further performed on the photoresist pattern so that the residue may be further removed. Thus, the residue between the photoresist patterns may not be transferred to the pattern after the etching process so that the pattern may have a desired shape and the method of forming a pattern has increased accuracy.

DETAILED DESCRIPTION OF EMBODIMENTS

The above and other aspects and features of a method of forming a pattern in accordance with example embodiments will become readily understood from detail descriptions that follow, with reference to the accompanying drawings.

Figure 1:
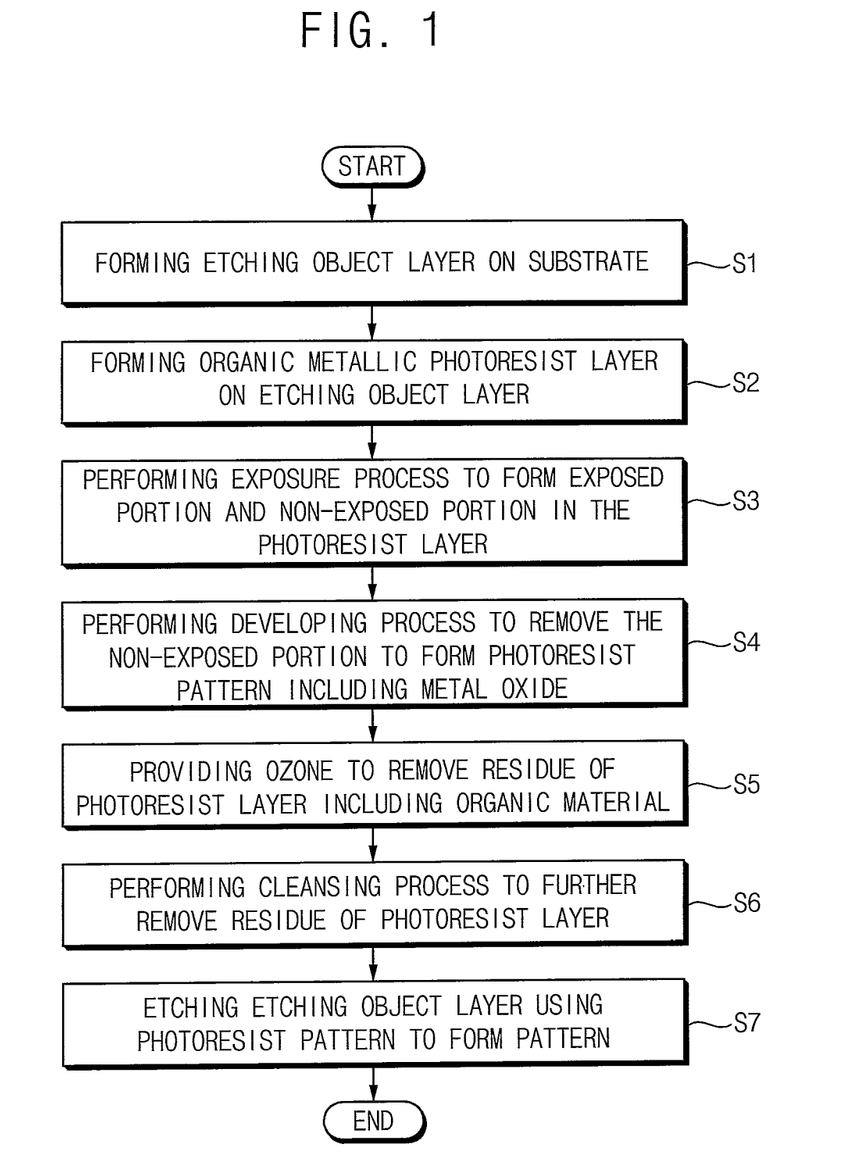
FIG. 1 is a flowchart illustrating a method of forming a pattern in accordance with an embodiment of the present disclosure.

FIG. 1 is a flowchart illustrating a method of forming a pattern in accordance with example embodiments, and FIGS. 2 to 6 are cross-sectional views illustrating the method of forming the pattern.

Figure 2:
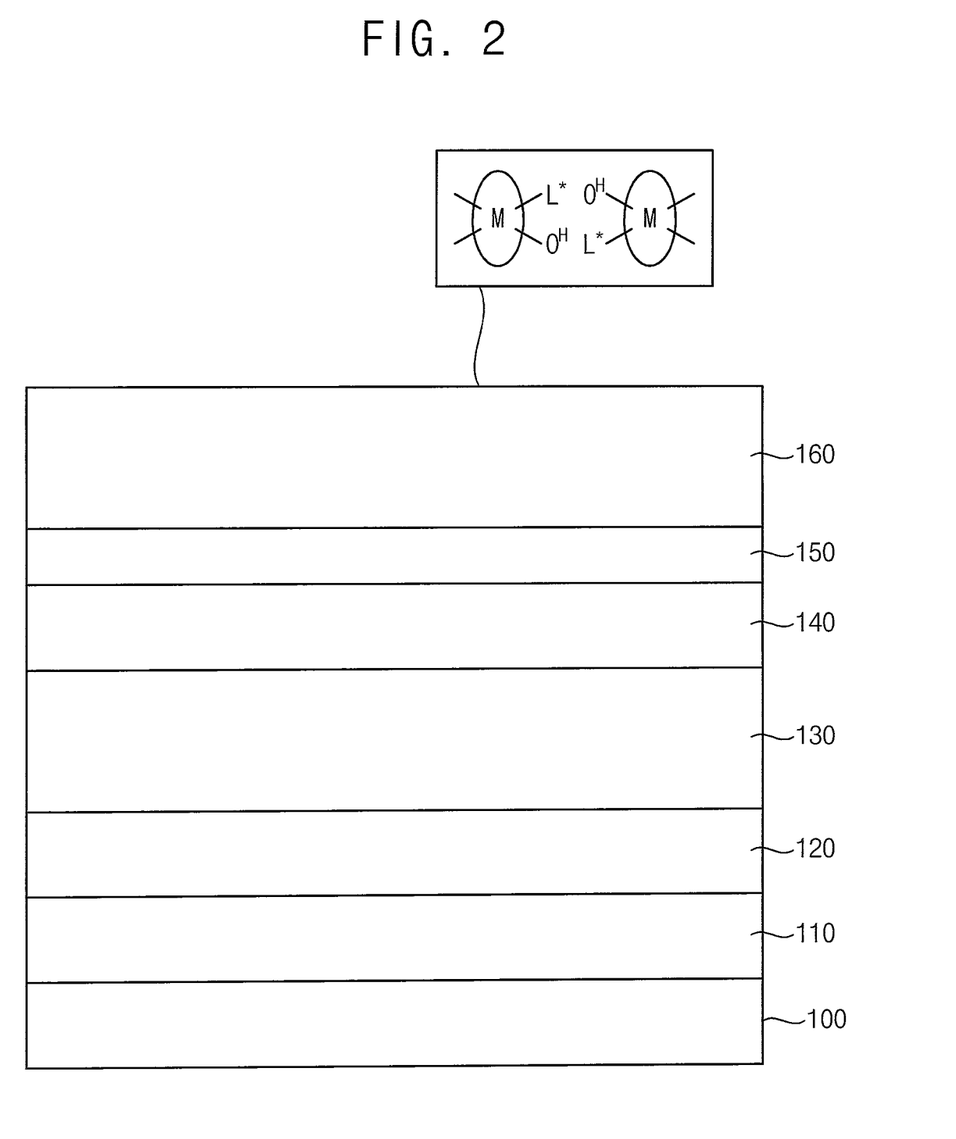
FIGS. 2 to 6 are cross-sectional views illustrating the method of forming the pattern according to embodiments of the present disclosure.

Referring to FIGS. 1 and 2, in block S1, an etching object layer 110 may be formed on a substrate 100, and in block S2, a photoresist layer 160 may be formed on the etching object layer 110.

In an embodiment, the substrate 100 may include silicon, germanium, silicon-germanium, or a group compound semiconductor, such as GaP, GaAs, or GaSb. In example embodiments, the substrate 100 may be a silicon-on-insulator (SOI) substrate or a germanium-on-insulator (GOI) substrate. However, embodiments of the present disclosure are not limited thereto.

The etching object layer 110 may include any types of layers in which a pattern is formed by an etching process, and may include any type of materials. Various structures, such as gate structures, source/drain layers, contact plugs, vias, wirings, etc., may be formed between the substrate 100 and the etching object layer 110.

One or a plurality of layers may be further formed between the etching object layer 110 and the photoresist layer 160. In an example embodiment, a first hard mask layer 120, a second hard mask layer 130, a third hard mask layer 140 and an insulating interlayer 150 may be sequentially stacked between the etching object layer 110 and the photoresist layer 160. However, embodiments of the present disclosure are not limited thereto.

In an embodiment, each of the first and third hard mask layers 120 and 140 may include a non-organic insulating material, such as silicon oxynitride, silicon oxide, silicon carbide, silicon oxycarbide, etc. The second hard mask layer 130 may include an organic insulating material, such as spin on hard mask (SOH) or amorphous carbon layer (ACL), and the insulating interlayer 150 may include one or both of first and second layers including a non-organic insulating material and an organic insulating material, respectively.

In example embodiments, the photoresist layer 160 may be an organic metallic photoresist layer including an organic material, oxygen and a metal. Thus, the photoresist layer 160 may be a material including, e.g., a central metal and an organic ligand bound to the central metal. For example, in an embodiment, the photoresist layer 160 may be a material having a chemical formula of $R_xMO_y(OH)_z$ in which x, y, z are real numbers. Here, M is a metal, R is a hydrocarbon group, such as alkyl group, aryl group, ethyl group, phenyl group, etc.

Figure 3:
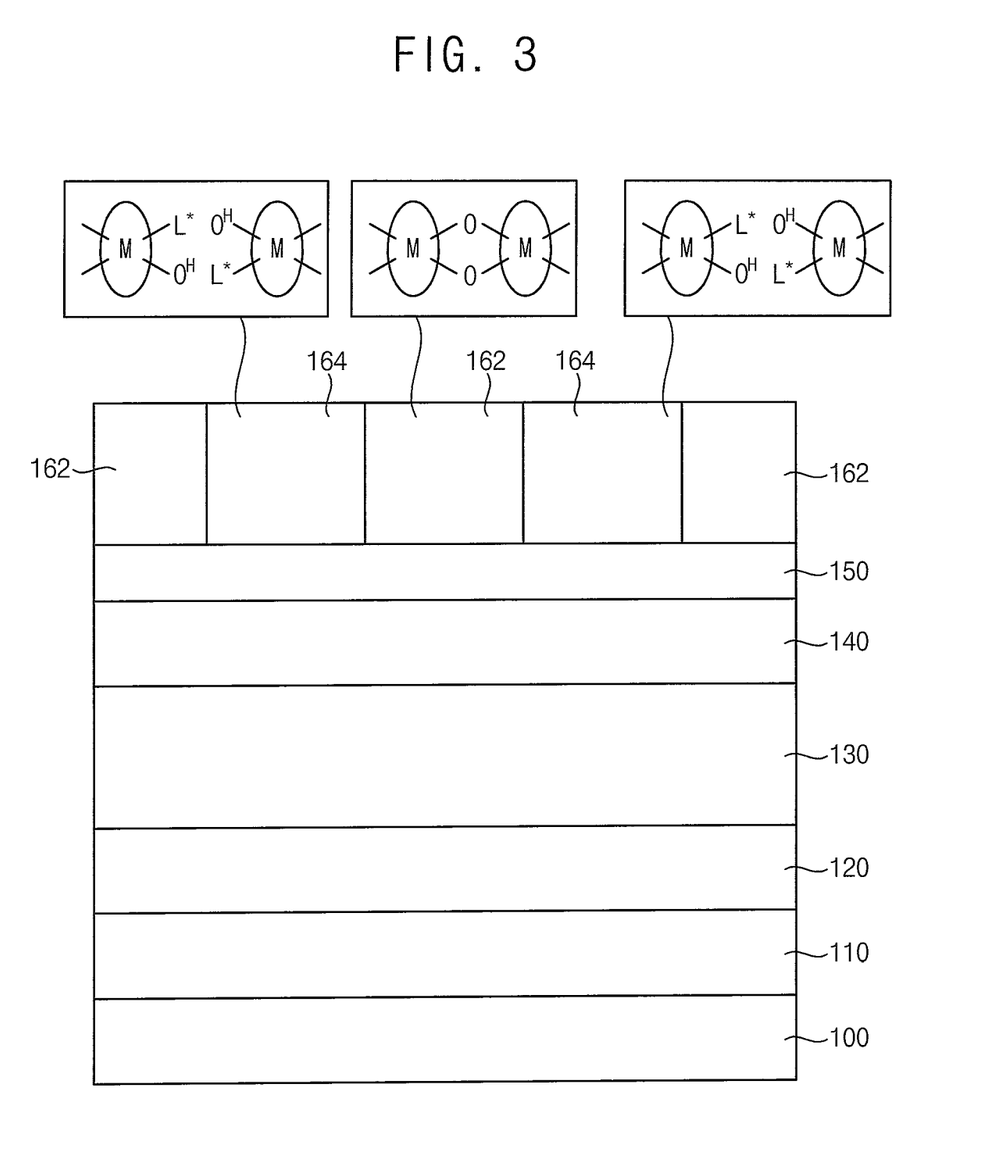

Referring to FIGS. 1 and 3, in block S3, an exposure process may be performed on a portion of the photoresist layer 160, and thus the photoresist layer 160 may include an exposed portion 162 and a non-exposed portion 164.

In example embodiments, the exposure process may be performed using extreme ultraviolet (EUV), and heat may also be provided onto the substrate 100. However, embodiments of the present disclosure are not limited thereto.

In example embodiments, as the exposure process is performed on the exposed portion 162, the organic ligand L bound to the central metal may leave the central metal and neighboring metals may be coupled with each other via oxygen, which may generate a metal oxide. For example, as light is incident onto the exposed portion 162 of the photoresist layer 160 including a material having the chemical formula of $R_xMO_y(OH)_z$, organic ligand L and hydroxyl group may leave a central metal, and the central metal and oxygen may form a metal oxide by ionic bond.

Figure 4:
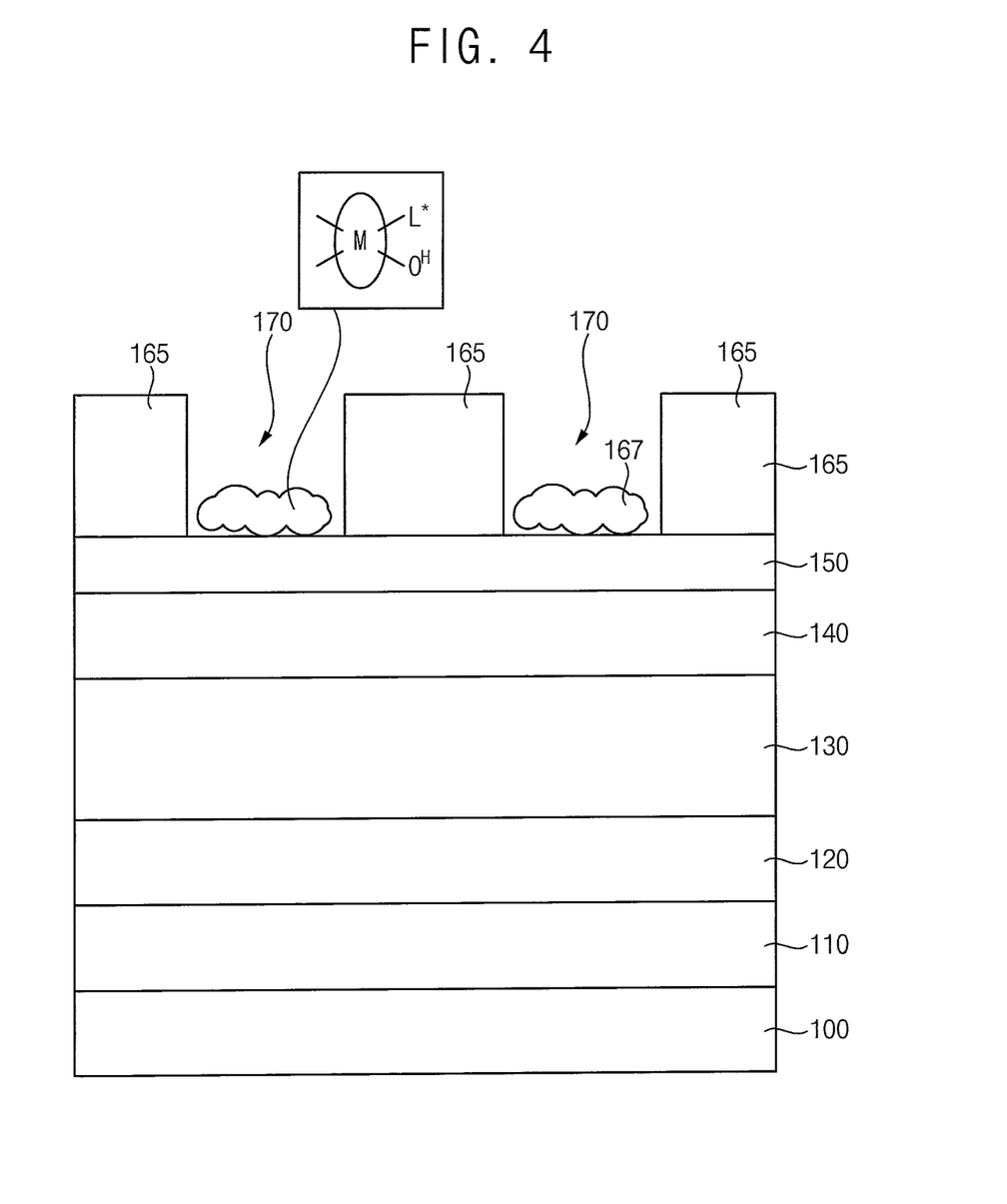

Referring to FIGS. 1 and 4, in block S4, a developing process may be performed on the photoresist layer 160, and thus the non-exposed portion 164 of the photoresist layer 160 may be removed.

In an embodiment, the developing process may be performed by spreading a developing solution including an aromatic compound, such as benzene, xylene, toluene, etc., and an organic solvent, such as ester onto a photoresist layer 160, However, embodiments of the present disclosure are not limited thereto. Thus, the non-exposed portion 164 in the photoresist layer 160, which may include an organic material as well as the metal and oxygen, may be removed by the developing solution, and the exposed portion 162 in the photoresist layer 160, which may include a metal oxide which is an inorganic material, may remain to form a photoresist pattern 165.

However, the non-exposed portion 164 of the photoresist layer 160 may not be entirely removed and may partially remain in an opening 170 that may be formed by removing the non-exposed portion 164 in a space between adjacent photoresist patterns 165, and thus a residue 167 may be formed in the opening 170. The residue 167 may include an organic metal that is a component of the initial photoresist layer 160, or sonic elements from the organic metal, e.g., metal and organic ligand, metal and hydroxyl group, organic ligand and hydroxyl group, etc.

Figure 5:
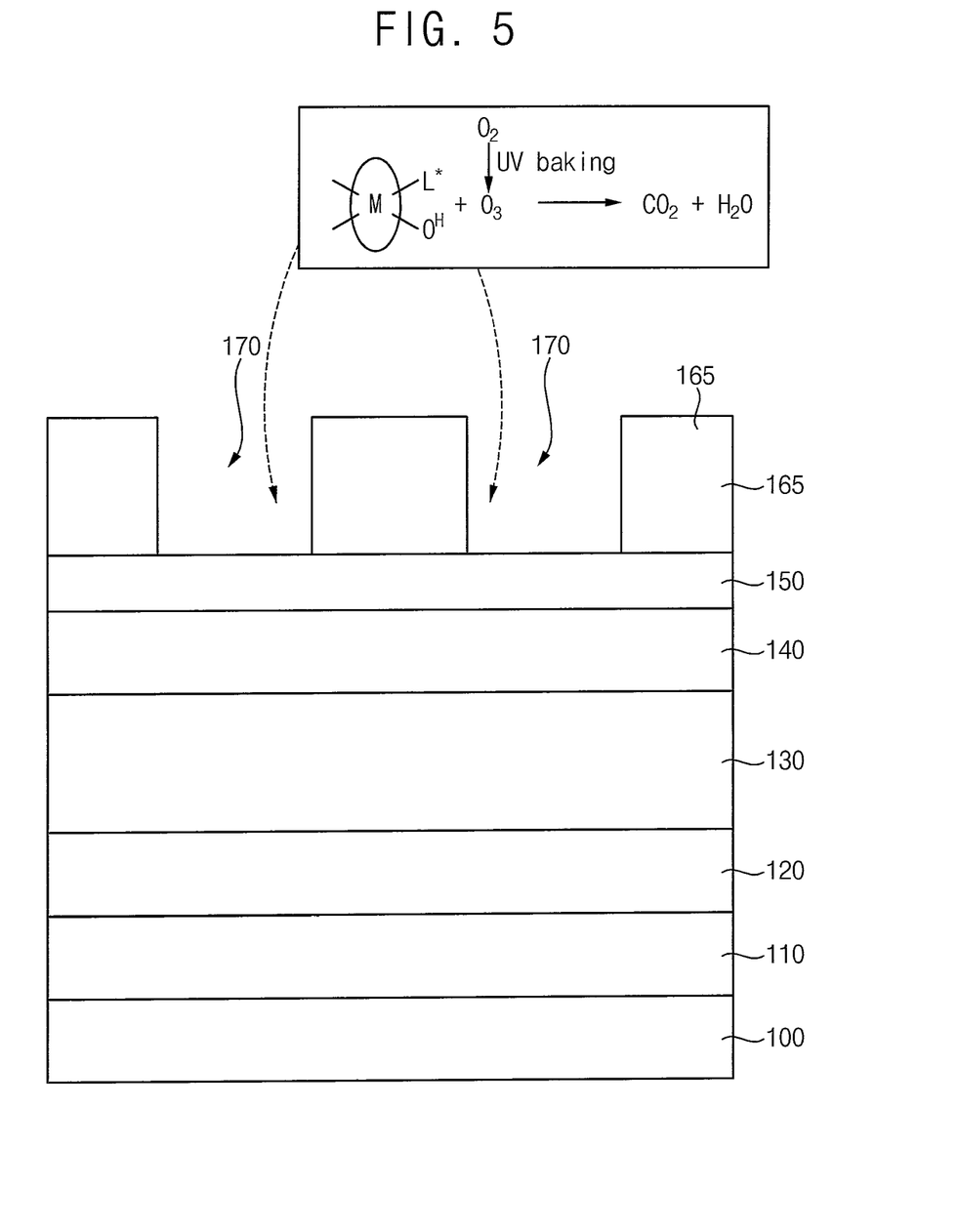

Referring to FIGS. 1 and 5, in block S5, ozone ($O_3$) may be provided onto the substrate 100 to be reacted with the residue 167, so that the residue 167 may be removed.

In example embodiments, ozone may be generated by an ultraviolet (UV) baking process. For example, ozone may be generated by irradiating UV with heat onto oxygen included in the ambient air, and the generated ozone may be provided onto the substrate 100 with heat to be reacted with the residue 167. However, embodiments of the present disclosure are not limited thereto and the ozone may be generated by various different methods. Thus, the residue 167 of the photoresist layer 160, which may include an organic material, may be removed. In an example embodiment, the UV baking process may be performed at a temperature in a range of about 100° C. to about 400° C. For example, in an embodiment, the UV baking process may be performed at a temperature in a range of about 200° C. to about 250° C. for a time period in a range of about 5 seconds to about 80 seconds. For example, the UV baking process may be performed for a time period in a range of about 40 seconds to about 80 seconds.

In an example embodiment, during the UV baking process, the organic material and ozone may react with each other so that carbon dioxide ($CO_2$) and water vapor ($H_2O$) may be generated.

In some embodiments, additional oxygen may be further provided in addition to oxygen included in the air, so that ozone may be easily generated.

In an embodiment, instead of performing the UV baking process to convert oxygen in the ambient air into ozone, ozone may be directly provided onto the substrate 100 with heat.

In block S6, a cleansing process may be performed on the photoresist pattern 165, and thus, if the residue 167 of the photoresist layer 160 has not been entirely removed in block S5, the residue 167 may be further removed.

In an embodiment, the cleansing process may be performed by spreading a cleansing solution including tetramethyl ammonium hydroxide (TMAH), n-butyl acetate (nBA), water vapor ($H_2O$), etc., onto the substrate 100 having the photoresist pattern 165 thereon. Thus, the residue 167 that may include an organic metal, or some elements of the organic metal, e.g., metal and organic ligand, metal and hydroxyl group, organic ligand and hydroxyl group, etc., may be entirely removed.

In an embodiment, blocks S4, S5 and S6 concerning the developing process, the process of removing the residue 167 of the photoresist layer 160, and the cleansing process may be performed in the same equipment in-situ. Alternatively, some of the developing process, the process of removing the residue 167 of the photoresist layer 160, and the cleansing process may be performed in different equipment from others.

Figure 6:
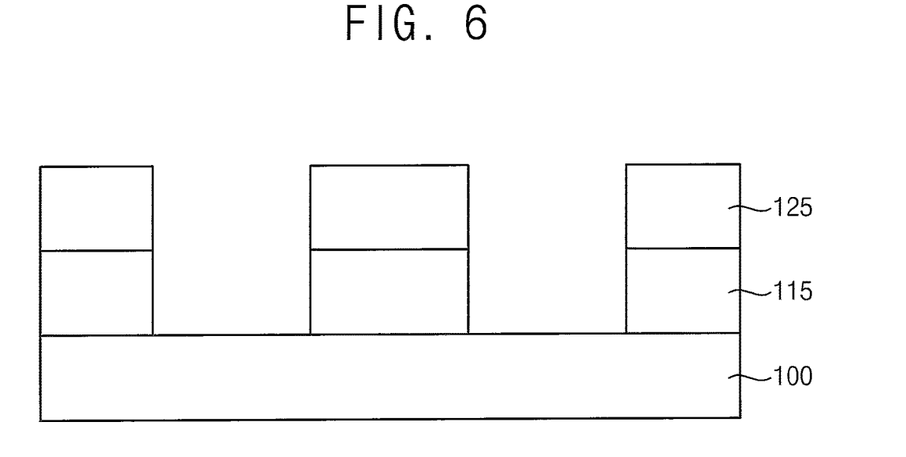

Referring to FIGS. 1 and 6, in block S7, the etching object layer 110 may be etched by an etching process using the photoresist pattern 165 as an etching mask to form a pattern 115 having a desired shape.

In an embodiment, if the first to third hard mask layers 120, 130 and 140 and the insulating interlayer 150 are sequentially stacked between the etching object layer 110 and the photoresist pattern 165, the first to third hard mask layers 120, 130 and 140 and the insulating interlayer 150 may be sequentially etched using the photoresist pattern 165 as an etching mask to form a first hard mask 125, a second hard mask, a third hard mask and an insulating interlayer pattern, respectively. During the etching process, the insulating interlayer pattern and the third hard mask may be removed, and the second hard mask may be removed by an aching process and/or a stripping process. The etching object layer 110 may be etched using the first hard mask 125 as an etching mask to form a pattern 115 on the substrate 100.

As illustrated above, the exposure process and the developing process may be performed on the photoresist layer 160 including an organic material and a metal, and the residue 167 of the photoresist layer 160 may be reacted with ozone. In an embodiment, a cleansing process may be further performed on the photoresist pattern 165 so that the residue 167 of the photoresist pattern 165 may be entirely removed, such as in instances in which a portion of the residue 167 remains after the photoresist layer 160 is reacted with ozone. If the residue 167 remains between the photoresist patterns 165, the pattern 115 that may be formed by the etching process using the photoresist pattern 165 as an etching mask may not have the desired shape. However, in accordance with example embodiments, the residue 167 may be entirely removed, and thus the pattern 115 may have the desired shape and the manufacturing process may have increased accuracy.

Figure 7:
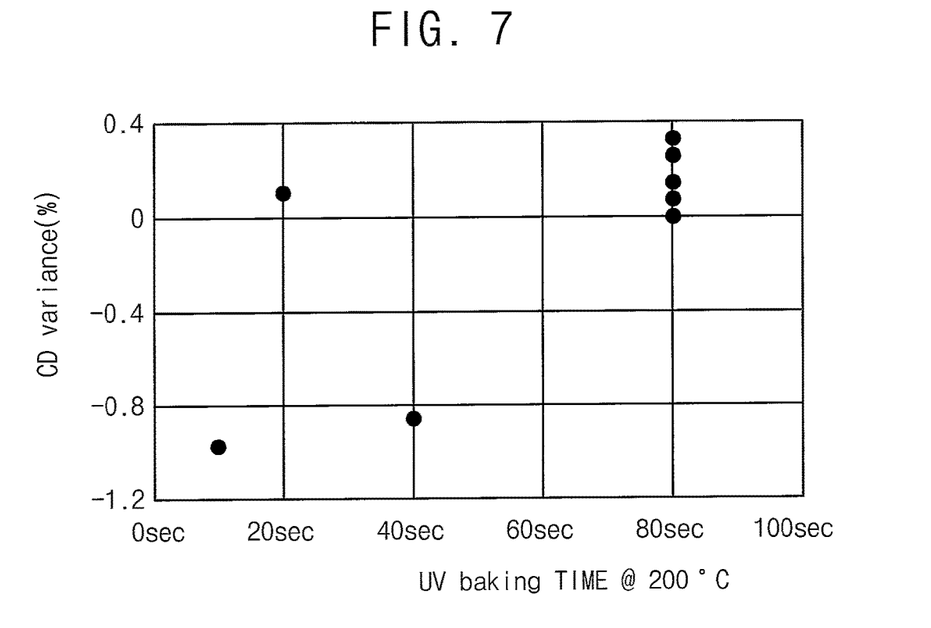
FIG. 7 is a graph illustrating variance of a size of a photoresist pattern when the residue of a photoresist layer is removed according to an embodiment of the present disclosure.
Figure 8:
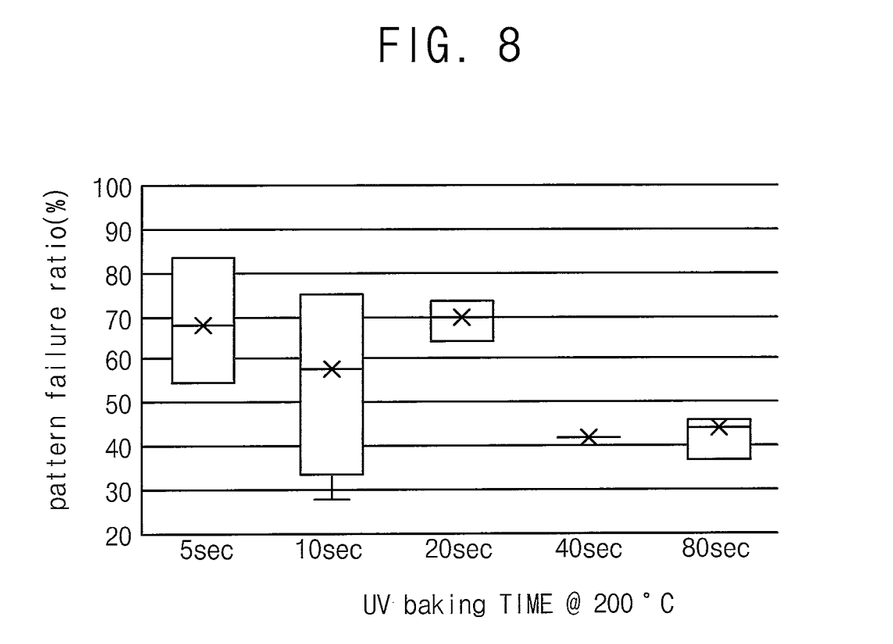
FIG. 8 is a graph illustrating reduction of failure of patterns due to the residue between the photoresist patterns by a UV baking process according to an embodiment of the present disclosure.

FIG. 7 is a graph illustrating variance of a size of the photoresist pattern 165 when the residue 167 of the photoresist layer 160 is removed, and FIG. 8 is a graph illustrating reduction of failure of patterns due to the removal of the residue 167 between the photoresist patterns 165 by a UV baking process.

Referring to FIG. 7, when the UV baking process was performed at a temperature of about 200° C. for 80 seconds or less, variance of the size of the photoresist pattern 165 is less than about 1%. The process of removing the residue 167 of the photoresist layer 160 by performing the UV baking process to provide ozone may be performed such that the ozone and the residue 167 including an organic material may be reacted with each other, and the photoresist pattern 165 including a metal oxide that may be formed through the exposure process in which the organic material leaves from an organic metallic material of the photoresist layer 160 may not be reacted with the ozone.

Referring to FIG. 8, when the UV baking process was performed at the temperature of about 200° C. for about 5 seconds to about 80 seconds, a pattern failure ratio percentage decreased as the duration of the UV baking process increased. For example, the pattern failure ratio was about 40% at the duration of about 40 seconds to about 80 seconds.

While the present disclosure has been shown and described with reference to non-limiting, example embodiments thereof, it will be understood by those of ordinary skill in the art that various changes in form and details may be made thereto without departing from the spirit and scope of the present disclosure.

What is claimed is:

1. A method of forming a pattern, the method comprising:
   forming an etching object layer on a substrate;
   forming a photoresist layer on the etching object layer, the photoresist layer including a metal, oxygen and an organic material;
   performing an exposure process on the photoresist layer, the exposure process converting the metal and the oxygen of the photoresist layer to a metal oxide;
   performing a developing process on the photoresist layer to form a photoresist pattern including the metal oxide;
   providing ozone onto the substrate to remove a residue of the photoresist layer that was not converted to the metal oxide by the exposure process, the residue including the organic material and/or the metal; and
   etching the etching object layer using the photoresist pattern as an etching mask.

2. The method according to claim 1, wherein:
   the exposure process is performed on a portion of the photoresist layer to form an exposed portion and a non-exposed portion of the photoresist layer; and
   the performing of the developing process includes removing the non-exposed portion of the photoresist layer.

3. The method according to claim 1, wherein, when ozone is provided onto the substrate to remove the residue of the photoresist layer, the ozone and the organic material react with each other to generate carbon dioxide and water vapor.

4. The method according to claim 1, wherein:
   a non-organic hard mask layer and/or an organic hard mask layer are formed between the etching object layer and the photoresist layer,
   wherein etching the etching object layer using the photoresist pattern as the etching mask includes:
   etching the non-organic hard mask layer and/or the organic hard mask layer using the photoresist pattern as the etching mask to form a non-organic hard mask and/or an organic hard mask; and
   etching the etching object layer using the non-organic hard mask and/or the organic hard mask as an etching mask.

5. The method according to claim 1, wherein the exposure process on the photoresist layer is performed using EUV.

6. The method according to claim 1, further comprising performing a cleansing process on the photoresist pattern after providing ozone onto the substrate to further remove the residue of the photoresist layer.

7. The method according to claim 6, wherein the cleansing process is performed using a cleansing solution including at least one of TMAH, nBA and water vapor.

8. The method according to claim 1, wherein providing ozone onto the substrate includes irradiating UV in ambient air that includes oxygen to generate ozone.

9. The method according to claim 8, wherein irradiating UV includes heating the substrate.

10. The method according to claim 9 wherein irradiating UV is performed at a temperature in a range of about 100° C. to about 400° C. for a time period in a range of about 5 seconds to about 80 seconds.

11. A method of forming a pattern, the method comprising:
    forming an etching object layer on a substrate;
    forming a photoresist layer on the etching object layer, the photoresist layer including a metal, oxygen and an organic material;
    performing an exposure process on a portion of the photoresist layer, the exposure process converting the metal and the oxygen of the photoresist layer to a metal oxide, the exposure process forming an exposed portion of the photoresist layer including the metal oxide and a non-exposed portion of the photoresist layer including the metal, the oxygen and the organic material and not including the metal oxide;

performing a developing process on the photoresist layer to remove the non-exposed portion to form a photoresist pattern including the metal oxide;
providing UV and heat onto the substrate to remove a residue of the photoresist layer that was not converted to the metal oxide by the exposure process, the residue including the organic material and/or the metal; and
etching the etching object layer using the photoresist pattern as an etching mask.

12. The method according to claim 11, wherein providing UV and heat includes converting oxygen in ambient air into ozone.

13. The method according to claim 12, wherein, when removing the residue of the photoresist layer, the ozone and the organic material react with each other to generate carbon dioxide and water vapor.

14. The method according to claim 11, further comprising performing a cleansing process on the photoresist pattern after providing UV and heat onto the substrate to further remove the residue of the photoresist layer.

15. The method according to claim 14, wherein the developing process, the providing UV and heat onto the substrate and the cleansing process are performed in-situ.

16. The method according to claim 11, wherein:
a non-organic hard mask layer and/or an organic hard mask layer are formed between the etching object layer and the photoresist layer,
wherein etching the etching object layer using the photoresist pattern as the etching mask includes:
etching the non-organic hard mask layer and/or the organic hard mask layer using the photoresist pattern as the etching mask to form a non-organic hard mask and/or an organic hard mask; and
etching the etching object layer using the non-organic hard mask and/or the organic hard mask as an etching mask.

17. The method according to claim 11, wherein the exposure process on the photoresist layer is performed using EUV.

18. A method of forming a pattern, the method comprising:
forming an etching object layer on a substrate;
forming a photoresist layer on the etching object layer, the photoresist layer including a metal, oxygen and an organic material;
performing an exposure process on a portion of the photoresist layer, the exposure converting the metal and the oxygen of the photoresist layer to a metal oxide, the exposure process forming an exposed portion of the photoresist layer including the metal oxide and a non-exposed portion of the photoresist layer including the metal, the oxygen and the organic material and not including the metal oxide;
performing a developing process on the photoresist layer to remove the non-exposed portion to form a photoresist pattern including the metal oxide;
providing ozone onto the substrate to remove a residue of the photoresist layer that was not converted to the metal oxide by the exposure process, the residue including the organic material and/or the metal;
performing a cleansing process on the photoresist pattern after providing ozone onto the substrate; and
etching the etching object layer using the photoresist pattern as an etching mask.

19. The method according to claim 18, wherein providing ozone onto the substrate includes providing UV and heat onto the substrate so that oxygen in ambient air is converted into ozone.

20. The method according to claim 18, wherein performing the cleansing process on the photoresist pattern includes further removing the residue of the photoresist layer that is positioned adjacent to the photoresist pattern.

* * * * *